United States Patent
Kanda et al.

[11] Patent Number: 6,153,938
[45] Date of Patent: Nov. 28, 2000

[54] FLIP-CHIP CONNECTING METHOD, FLIP-CHIP CONNECTED STRUCTURE AND ELECTRONIC DEVICE USING THE SAME

[75] Inventors: Naoya Kanda, Yokosuka; Toyoki Asada, Yokohama; Yoshio Oozeki, Ebina; Yasuo Amano; Kunio Matsumoto, both of Yokohama; Yasuhiro Narikawa, Yokosuka, all of Japan

[73] Assignee: Hitachi, Ltd., Tokyo, Japan

[21] Appl. No.: 09/122,782

[22] Filed: Jul. 27, 1998

[30] Foreign Application Priority Data

Jul. 28, 1997 [JP] Japan .................................. 9-201157

[51] Int. Cl.[7] .................................................. H01L 23/48
[52] U.S. Cl. .......................... 257/778; 257/777; 257/779; 257/789; 257/795; 257/780; 257/784; 257/785; 257/786; 257/772; 257/688
[58] Field of Search ..................... 257/778, 777, 257/779, 789, 795, 780, 784, 785, 786, 772, 688

[56] References Cited

U.S. PATENT DOCUMENTS

| | | |
|---|---|---|
| 5,141,777 | 8/1992 | Frentzel et al. .......................... 427/282 |
| 5,740,010 | 4/1998 | Devoe et al. .......................... 361/321.1 |
| 5,837,119 | 11/1998 | Kang et al. ................................. 205/74 |

FOREIGN PATENT DOCUMENTS

| | | | |
|---|---|---|---|
| 63-275127 | 11/1988 | Japan . | |
| 1-226161 | 9/1989 | Japan . | |
| 2-163950 | 6/1990 | Japan ............................. H01L 21/60 |
| 8-111437 | 4/1996 | Japan . | |
| 9-107003 | 4/1997 | Japan ............................. H01L 21/60 |

OTHER PUBLICATIONS

Wada et al., "A New Circuit Substrate for MCM–L," ICEMCM '95, pp. 59–64, 1995.

Nakamura et al., "Advanced LSI Package Using Stud–Bump –Bonding Technology < CSP (CHip Size Package)>," ICEMCM '95, pp. 302–307, 1995.

Aday et al., "A Comparative Analysis of High Density PWB Technologies", ICEMCM '96 Proceedings, pp. 239–244.

Tanaka et al. "A Fine–Pitch Lead–Less–Chip Assembly Technology With The Built–Up PCB", ICEMCM '96 Proceedings, pp. 369–374.

Matsuda et al., "Simple Method For Flip–Chip Bonding On A Resin Substrate", 1997 International Conference on Multichip Modules, pp. 92–97.

Nakamura et al., "Advanced LSI Package Using Stud–Bump–Bonding Technology < CSP (Chip Size Package)>", ICEMCM '95, pp. 302–307.

(List continued on next page.)

Primary Examiner—David Hardy
Assistant Examiner—Matthew E. Warren
Attorney, Agent, or Firm—Antonelli, Terry, Stout & Kraus, LLP

[57] ABSTRACT

A stable low-connecting resistance connection arrangement having a high yield rate without using any special material or process for a substrate. A flip-chip connecting structure in which the semiconductor integrated circuit (IC) chip is mounted directly on an organic circuit substrate. To achieve reliable connection and low-connecting resistance, the present invention absorbs variation of the heights of projecting electrodes formed on a semiconductor IC chip and substrate electrodes of an organic circuit substrate for example, by deforming the substrate electrodes and/or substrate layer of the organic circuit substrate. Resin of a conductive paste disposed between the projecting electrodes and substrate electrodes is squeezed out leaving a high density conductive particle layer to lower a contact resistance between such electrodes.

35 Claims, 7 Drawing Sheets

OTHER PUBLICATIONS

Tomura et al., "Chip–On–Board Mounting Technology Using Stud–Bump–Bonding Technique", National Technical Report, vol. 39, No. 2, Apr. 1993, pp. 90–97.

Kusagaya et al., "Flip Chip Mounting Using Stud Bumps and Adhesives For Encapsulation", ICEMM Proceedings '93, pp. 238–246.

Wada et al., "A New Circuit Substrate For MCM–L", ICEMCM '95, pp. 59–64.

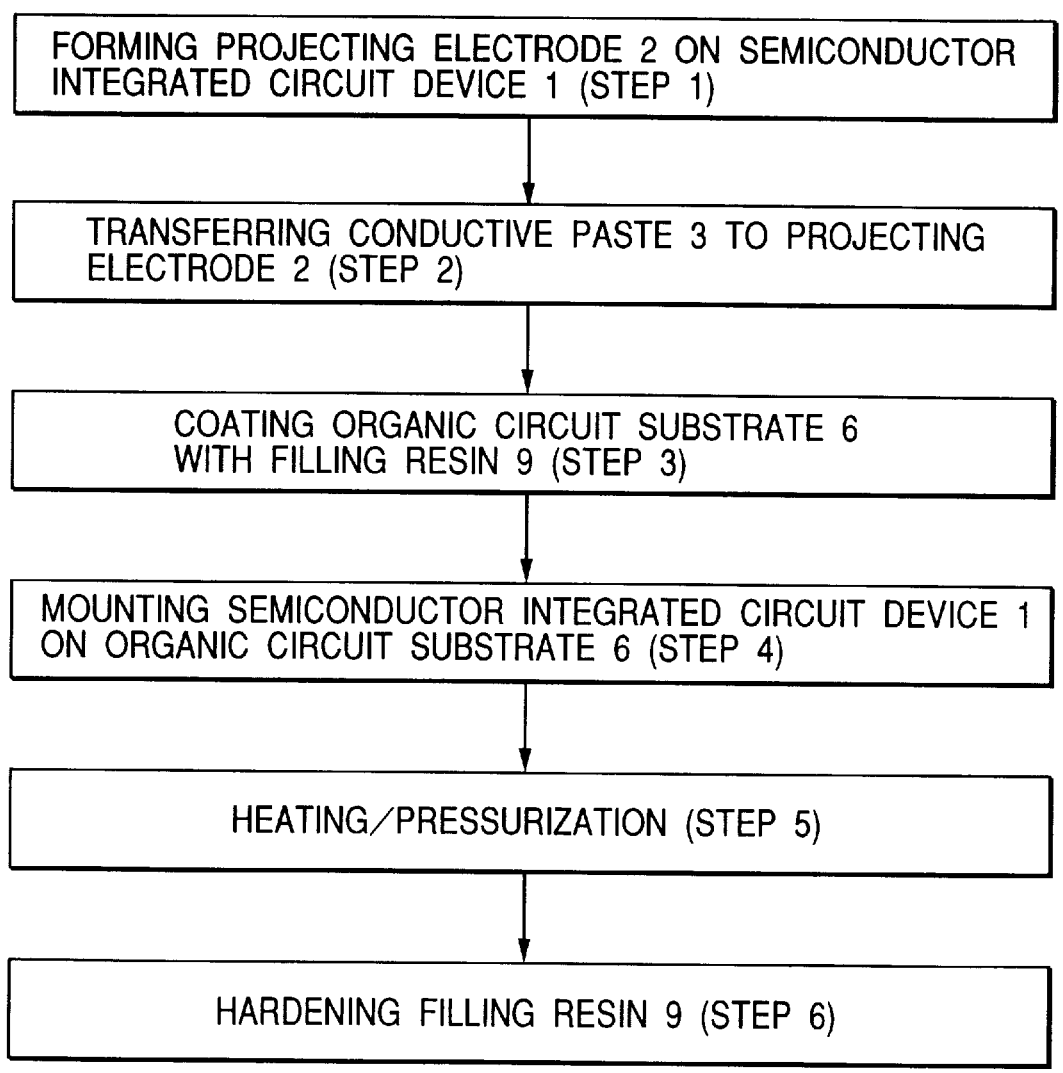

FLIP-CHIP CONNECTING METHOD, FLIP-CHIP CONNECTED STRUCTURE AND ELECTRONIC DEVICE USING THE SAME

BACKGROUND OF THE INVENTION

1. Field of the Invention

This invention generally relates to an arrangement/method in which a semiconductor integrated circuit (IC) chip is mounted face-down directly on a circuit substrate to attain electric connection, and an electronic device using the same. More specifically, this invention relates to a unique and novel electrical connection arrangement/method for providing connection between a substrate (e.g., printed circuit board) and a flip-chip IC.

2. Description of Related Art

Although solder is frequently used for assembly of electronic devices, a quantity of connection terminals on IC packages has generally increased, while an IC package size has generally decreased. As a result, a pitch or spacing of terminals for an IC package has now decreased to a point (e.g., 130 μm) where soldering technology is incapable of precisely providing solder to fine electrodes, so that assembly by soldering has become very difficult and/or unreliable in terms of product yield.

Thus, an alternative connecting technology for mounting a semiconductor IC directly on a substrate has been developed. More particularly, a flip-chip mounting method in which the semiconductor IC is mounted on the substrate with its active side facing down, has proven to be an effective arrangement/method to improve electrical characteristics and mounting density. For example, Japanese Examined Patent Publication No. Hei 6-66355 has disclosed a method in which projecting electrodes are formed on terminal electrodes of the semiconductor IC chip and a conductive adhesive agent is interposed b e tween contact points and electrodes on a substrate. Further, Japanese Examined Patent Publication No. Hei 8-2574369 has disclosed a method in which conductivity between conductive particles is intensified by hardening and shrinkage of resin filled between a semiconductor IC chip and circuit substrate of a flip-chip connecting structure, so as to enhance stability of electrical connection.

However, the aforementioned electrical connection using the conductive particles has such a serious problem in that electrical connecting resistances between the projecting electrodes of the semiconductor IC device and organic circuit substrate vary. Thus, a reliability level of each connecting point also varies, and therefore such arrangement is not suitable for increasing number of terminals and/or many applications.

Variation of the connecting resistance is considered to becaused partly by variation of a height of the projecting electrodes possessed by the semiconductor IC device, i.e., because of varying heights, the projecting electrodes have varying contact pressures with electrodes of a substrate. Thus, even if conductive paste is interposed between the projecting electrode and electrode, a sufficient connecting reliability cannot be obtained. Therefore, to suppress variation of the connecting resistance, it is important to suppress or compensate for variation of the height of the projecting electrodes. This is the same also when no conductive paste is interposed.

As a method for suppressing variation of the height of the projecting electrodes, there is a method in which when the semiconductor IC device is mounted on the substrate, pressure is applied to deform the projecting electrodes, substrate and/or substrate electrodes, and any variation is thus attempted to be absorbed or compensated for by the deformation, e.g., as disclosed by Japanese Unexamined Patent Application No. Hei 8-111437 (hereinafter '437). However, to deform in the above manner, a pressure of 50 g/pin is needed, such that as more pins are provided, a greater overall pressure is required. Thus, a possibility that the semiconductor IC device and circuit substrate may be damaged increases. For example, when a semiconductor IC device having 200 pins is mounted, a pressure of 50×200 g=10 kg is needed. Currently available products cannot reliably bear such a pressure, and accordingly, results from the '437 reference tend to teach away from use of pressure. This is the same for products relatively easy to deform such as a product using a wire bump arrangement.

As further background, citation is also made to the following art of interest: Japanese Examined Patent Publication No. Hei 7-50726; Japanese Unexamined Patent Application No. Hei 9-107003; "A New Circuit Substrate For MCM-L", by Yusuke Wada, pp. 59–64, ICEMCM '95; "Flip Chip Mounting Using Stud Bumps And Adhesives For Encapsulation", by T. Kusagaya et al., pp. 238–246, ICEMM Proceedings '93; "Chip-On-Board Mounting Technology Using Stud-Bump-Bonding Technique", by Y. Tomura et al., pp. 90–97, National Technical Report Vol. 39, No. 2, April. 1993; "Advanced LSI Package Using Stud-Bump-Bonding Technology <CSP (Chip Size Package>", by Y. Nakamura et al., pp. 302–307, ICEMCM '95; "Simple Method For Flip-Chip Bonding On A Resin Substrate", by K. Matsuda et al., pp. 92–97, 1997 International Conference On Multichip Modules; "A Fine-Pitch Lead-Less-Chip Assembly Technology With The Built-Up PCB", by K. Tanaka, pp. 369–374, ICEMCM '96 Proceedings; "A Comparative Analysis Of High Density PWB Technologies", by J. G. Aday et al., pp. 239–244, ICEMCM '96 Proceedings.

SUMMARY OF THE INVENTION

An object of the present invention is to solve such problems of the prior art, i.e., to provide a flip-chip connected structure/method having a unique and novel arrangement for absorbing or compensating for any variation in height of projecting electrodes, and to provide an electronic device using the same.

The present invention achieve the above object via a flip-chip connected structure having: a semiconductor integrated circuit (IC) device having first electrodes; a circuit substrate having second electrodes corresponding to the first electrodes; and a conductive paste interposed between at least portions of both the first and second electrodes and disposed adjacent to the first and electrodes, the conductive paste having conductive particles therein for enhancing electrical connection between the first and second electrodes, and wherein a density of conductive particles within the conductive paste interposed between the first and second electrodes is greater than a density of conductive particles within the conductive paste disposed adjacent to the first and second electrodes.

The present invention further achieves the above object via a flip-chip connected structure comprising: a semiconductor integrated circuit (IC) device having first electrodes; a circuit substrate having second electrodes corresponding to the first electrodes; and a conductive paste on at least portions of both the first and second electrodes and having conductive particles therein for enhancing electrical connection between the first and second electrodes, wherein the conductive paste has a higher density of conductive particles in an area interposed directly between the first and second electrodes, in comparison to a density of conductive particles of the conductive paste on other portions of the first and second electrodes.

The present invention also achieves the above object by a flip-chip connecting method for mounting a semiconductor IC device having projecting electrodes onto a circuit substrate having an insulating layer and electrodes, comprising the steps of: softening the insulating layer by heating; and deforming the electrodes and the softened insulating layer by pressurization.

Further, the present invention achieves the above object by a flip-chip connecting method for mounting a semiconductor IC device having projecting electrodes onto a circuit substrate through conductive paste having conductive particles and thermoplastic resin, comprising the steps of: softening the conductive paste by heating; and moving the thermoplastic resin possessed by the softened conductive paste around the projecting electrodes by pressurization.

Still further, the present invention achieves the above object by a flip-chip connecting method for mounting a semiconductor IC device having projecting electrodes onto a circuit substrate having an insulating layer and electrodes through conductive paste having conductive particles and thermoplastic resin, comprising the steps of: softening the insulating layer and the conductive paste by heating; deforming the electrodes and the softened insulating layer by pressurization; and moving the thermoplastic resin possessed by the softened conductive paste around the projecting electrodes by pressurization.

By heating, the insulating layer possessed by the circuit substrate is softened, and by pressurization, the insulating layer and electrodes are deformed, thereby absorbing or accommodating any variation in height of the projecting electrodes and thereby suppressing variations in connecting resistance.

Further, by heating, the thermoplastic resin in the conductive paste is softened, and by pressurization the softened thermoplastic resin is moved by being squeezed out around the bumps. Thus, in the conductive paste interposed between each of the electrodes on the substrate and bump, the conductive particles exist in high density, so that a portion in which the conductive particles densely exist is capable of compensating for variation of the height of the projecting electrodes possessed by the semiconductor IC device. Therefore, corresponding to the height of the projecting electrode, it is possible to adjust the height of the portion in which the conductive particles densely exist. More particularly, the terms "densely exist" mentioned within this disclosure refers to a number of conductive particles existing per unit volume of the conductive paste, and indicates a state in which the conductive paste interposed between the bump and electrode on the substrate (having a high conductive particle density) is compared with the conductive paste existing around the bump (having a lower conductive particle density).

By forming the portion in which the conductive particles densely exist between each of the projecting electrode and substrate electrode, electric connecting resistance can be reduced.

Further, in conductive paste transferred near ends of the projecting electrodes, stress relaxation is caused by a portion having a relatively low density of the conductive particle, which is not captured between each of the projecting electrode and wiring on the substrate, so that a highly reliable connection can be achieved.

Further, to ensure a reliability, filling resin is interposed between portions other than the electrodes of the semiconductor IC and organic circuit substrate. Because this filling resin is softened in a process of heating and pressurization during mounting, a pressure applied at the time of the mounting can be born.

When the electrodes of the circuit substrate are deformed by pressurization as described above, a possible disconnection thereof is a problem. Therefore, it is preferred to optimally combine the deformation of the circuit substrate with the portions in which the conductive particles densely exist, formed in the conductive paste upon the mounting.

In any case, by combining heating with pressurization upon the mounting, it is possible to suppress dispersion of the height of the projecting electrodes by a smaller pressure (than without the present invention). Further, the present invention is versatile in that there occurs no problem regardless of whether heating and pressurization are carried out simultaneously or independently. That is, there is no problem as long as pressure is applied while the insulating resin or/and thermoplastic resin is softened by heating.

The foregoing and other objects, advantages, manner of operation, novel features and a better understanding of the present invention will become apparent from the following detailed description of the preferred embodiments and claims when read in connection with the accompanying drawings, all forming a part of the disclosure hereof this invention. While the foregoing and following written and illustrated disclosure focuses on disclosing embodiments of the invention which are considered preferred embodiments, it should be clearly understood that the same is by way of illustration and example only and is not to be taken by way of limitation, the spirit and scope of the present invention being limited only by the terms of the appended claims.

BRIEF DESCRIPTION OF THE DRAWING(S)

The following represents brief descriptions of the drawings, wherein:

FIGS. 1A–C are sectional views of a connecting structure according to an embodiment of the present invention;

FIG. 2 is a flow-chart diagram showing a mounting method according to an embodiment of the present invention;

FIG. 3 includes sectional and plan views showing bump forming stages in the arrangement/method of the present invention;

FIG. 4 include sectional views showing conductive paste coating stages in the arrangement/method of the present invention;

DETAILED DESCRIPTION OF THE PREFERRED EMBODIMENTS OF THE INVENTION

Figure 1A:
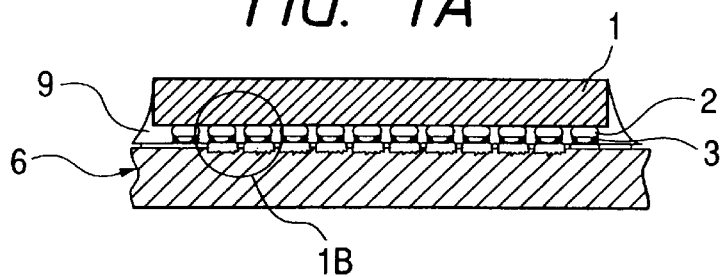

When appropriate, like reference numerals and characters are used to designate identical, corresponding or similar components in differing figure drawings. Further, in the detailed description to follow, exemplary sizes/values/ranges are given in parenthesis, although the present invention is not limited to the same.

Figure 1B:
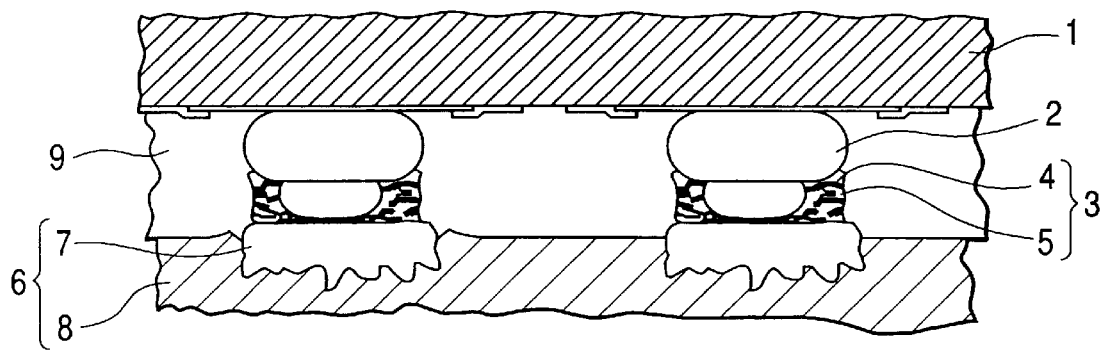
Figure 1C:
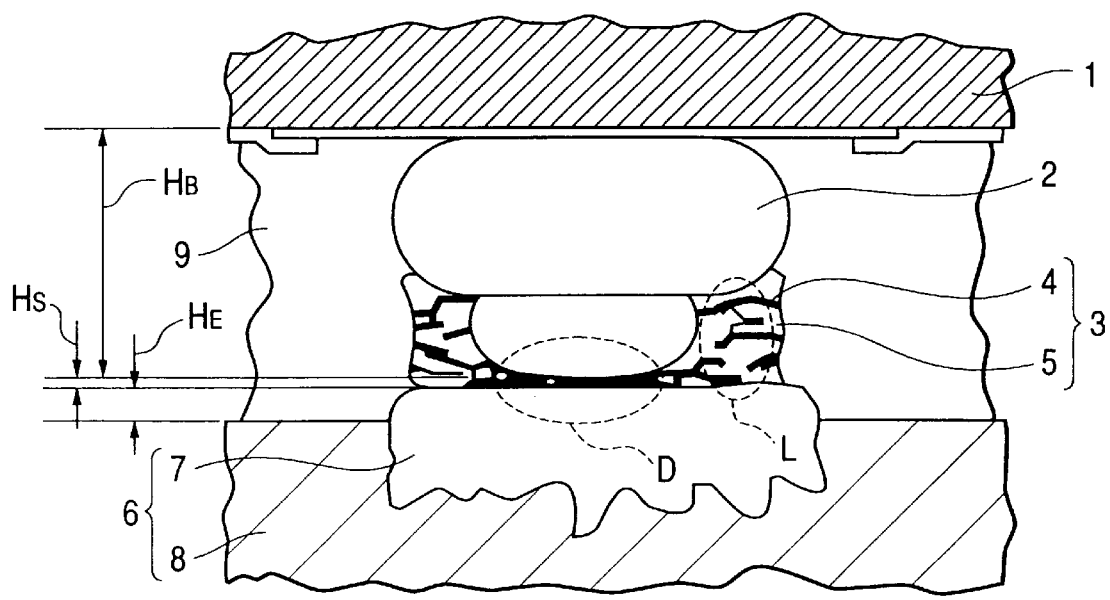

Hereinafter, the present invention will be described with reference to the accompanying drawings. More particularly, FIGS. 1A–C show cross-sections (at differing magnifications) of a flip-chip connecting structure of the present invention after loading of the flip-chip on a (e.g., organic) substrate has been completed. In such FIGS. 1A–C, reference numeral 1 denotes a semiconductor IC device, numeral 2 denotes projecting electrodes (bumps) provided on an electrode of the semiconductor IC device (e.g., at a 130 μm pitch), numeral 3 denotes conductive paste provided on each bump 2, numeral 4 denotes conductive particles contained in the conductive paste 3, numeral 5 denotes thermoplastic resin contained in the conductive paste 3, numeral 6 denotes a circuit substrate, numeral 7 denotes an electrode provided as part of the circuit substrate 6, numeral 8 denotes insulating resin possessed by the substrate, and numeral 9 denotes an underfill resin having a predetermined hardening shrinkage force.

The filling resin 9 is preferred to be material having a main component which is epoxy acrylate, phenol epoxy, or cyanoacrylate. Particularly when the circuit substrate 6 is formed of an organic substance, then epoxy acrylate or phenol epoxy is favorable. Further, a glass transition temperature of the filling resin 9 is preferred to be higher than a normal operative temperature of the semiconductor IC device 1, such that the filling resin 9 is not softened during normal operation of the semiconductor IC device 1. The thermoplastic resin 5 and insulating resin 8 are preferred to be of material which softens at the hardening temperature of the filling resin 9.

The projecting bump 2 is preferably a gold bump, silver bump, silver/tin alloy bump or the like. The conductive paste 3 is preferred to be any one of: a thermoplastic resin having gold powder (having a preferred shape of flake, a preferred average particle size in a range of 1–2 μm in thickness and 2–10 μm in diameter, and being provided within the resin at a concentration in a range of 92–97 wt %); a silver powder (having a preferred shape of flake, having a preferred average particle size in a range of 1–2 μm in thickness and 2–10 μm in diameter, and being provided within the resin at a concentration in a range of 86–94 wt %); or, a material composed of silver palladium alloy powder (having a preferred shape of flake, having a preferred average particle size in a range of 1–2 μm in thickness and 2–10 μm in diameter, and being provided within the resin at a concentration in a range of 87–95 wt %).

Figure 3:
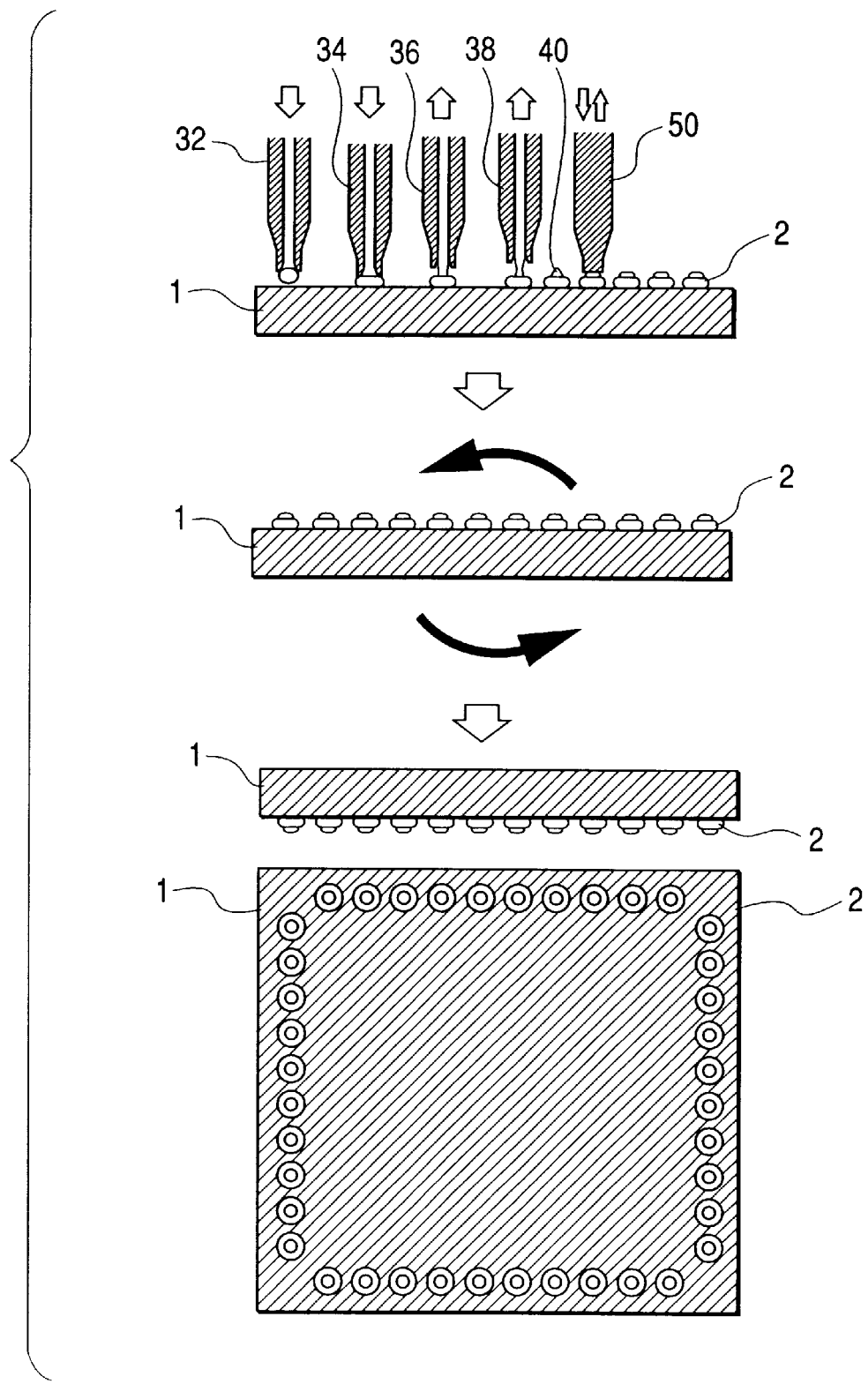

An arrangement/method for mounting the semiconductor IC 1 having the projecting bumps 2 onto the substrate electrodes 7 will be described with reference to FIGS. 2–9. More particularly, the projecting bumps 2 are created on electrodes of the semiconductor IC device 1 according to a wire bumping method or the like (FIG. 2's step 1; see FIG. 3). More particularly, FIG. 3 includes sectional and plan views showing bump forming stages in the arrangement/method of the present invention.

In elaborating, FIG. 3'S reference numeral 32 indicates a bump forming stage where a tool first approaches the semiconductor IC 1, reference numeral 34 indicates a bump forming stage where a bump material is applied (e.g., via heating/melting) to a surface of the semiconductor IC 1 so as to form a major portion of the bump. Next, reference numerals 36 and 38 indicate bump forming stages where heating is discontinued while the tool is moved away from the semiconductor IC 1, so as to form a pointed nipple 40. Finally, a reference numeral 50 indicates a bump forming stage where another tool is pressed against the pointed nipple 40 and/or heated, to flatten the pointed nipple 40 so as to form a minor portion of the bump. Once bumps (e.g., protruding 50 μm) are formed at all appropriate locations of the semiconductor IC 1, the semiconductor IC 1 is flipped over (see middle FIG. 3 diagram) so that the formed bumps are ready to be pressed against a substrate having electrodes (e.g., pads and/or conductive lines) for corresponding interface with the bumps. The second diagram from the bottom in FIG. 3 represents a cross-sectional view of the bump-adorned and flipped semiconductor IC 1, while the bottom diagram of FIG. 3 represents a plan view of an exemplary pattern of bumps (having a bump pitch of 130 μm) along a periphery of the semiconductor IC 1.

Figure 4:
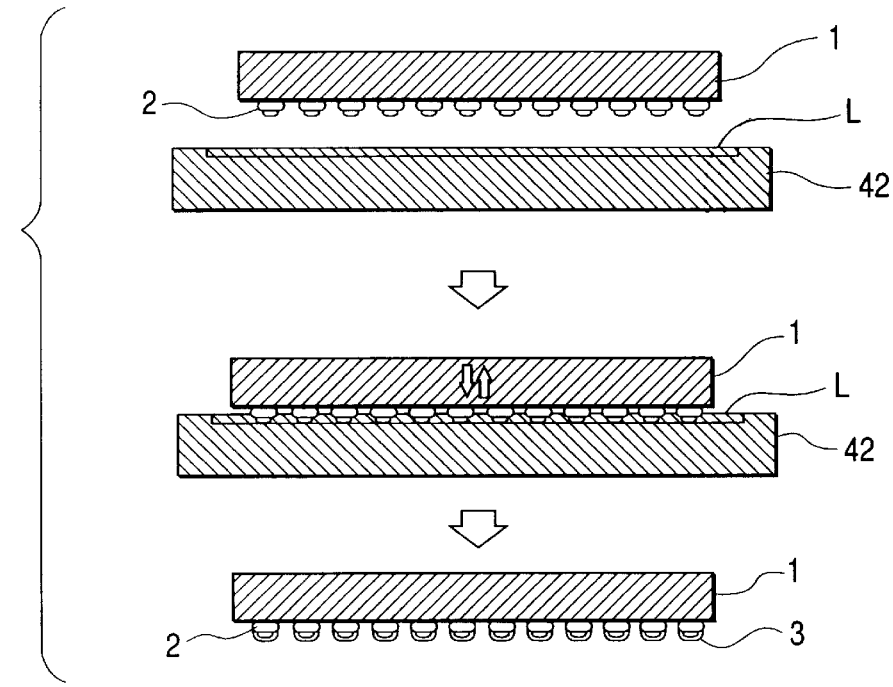

Next, FIG. 4 includes sectional views showing conductive paste coating stages in the arrangement/method of the present invention. The conductive paste 3 consisting of the conductive particles 4 and thermoplastic resin is coated onto a tray 42 as a layer L (top diagram of FIG. 4) having a specified thickness, and the conductive paste 3 is transferred via dipping and/or pressing (middle diagram of FIG. 4) of an end of the projecting bumps 2 into the layer L (FIG. 2's step 2). Heating of the conductive paste layer and/or projecting bumps 2 may be involved to facilitate easier transfer of the paste layer onto the bumps 2. Then the semiconductor IC 1 is moved away from the tray 40. As a result, portions of the conductive paste layer L is transferred to, and remains coated (e.g., 20–40 μm) on, each of the bumps 2 as conductive paste portions 3 (lower diagram of FIG. 4).

Figure 5:
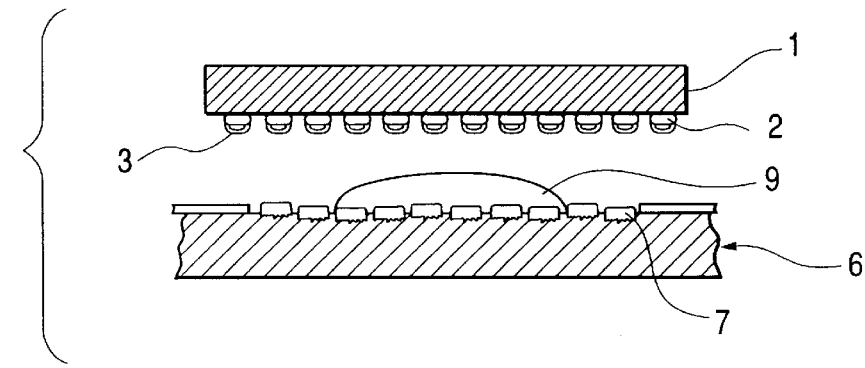
FIGS. 5 and 6 are sectional views showing filling resin application stages in the arrangement/method of the present invention.
Figure 6:
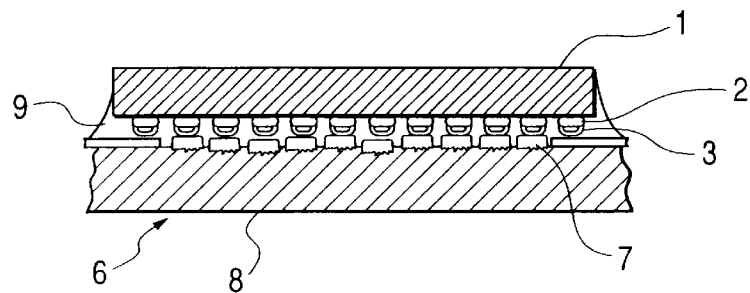
Figure 9A:
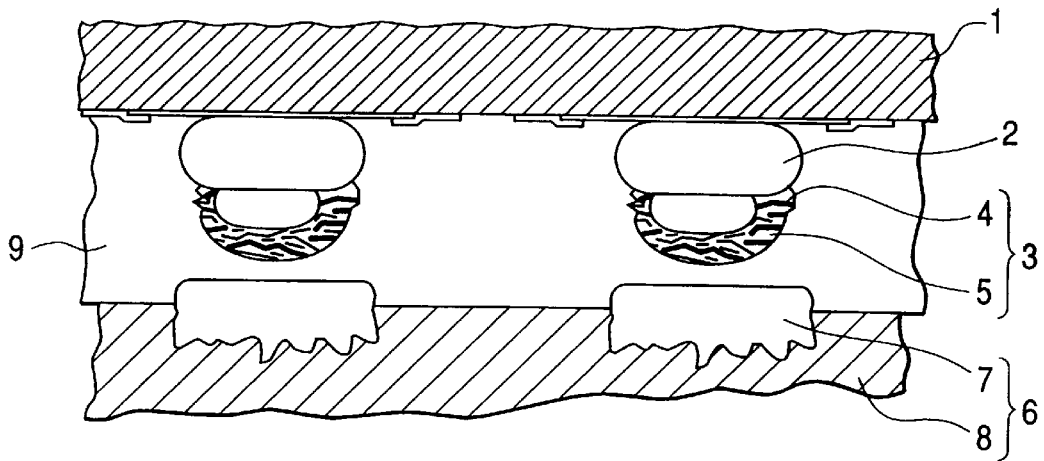
FIG. 9A is a magnified cross-sectional view of two bump/electrode areas of the FIG. 6 filling resin application stage.

FIGS. 5 and 6 are sectional views showing filling resin application stages in the arrangement/method of the present invention. More particularly, a portion of the circuit substrate 6 onto which the semiconductor IC device 1 is to be mounted, receives a necessary amount of the filling resin 9 (FIG. 2's step 3; see FIG. 5). Then, the semiconductor IC device 1 is mounted such that desired projecting bumps 2 are positioned in alignment with the electrodes 7 of the circuit substrate 6, and is pushed toward the circuit substrate 6 coated with the filling resin 9 (FIG. 2's step 4, see FIG. 6). FIG. 9A is a magnified cross-sectional view of two bump/electrode areas of FIG. 6, and is illustrative of the fact that filling resin 9 still exists between ones of the bump/electrode pairs. FIG. 9A is further illustrative of the fact that the conductive paste portions 3 still have a substantially equal distribution of conductive particles throughout the conductive paste portions. Further, the electrode portion 7 and insulating layer 8 are still substantially distanced from one another.

Figure 7:
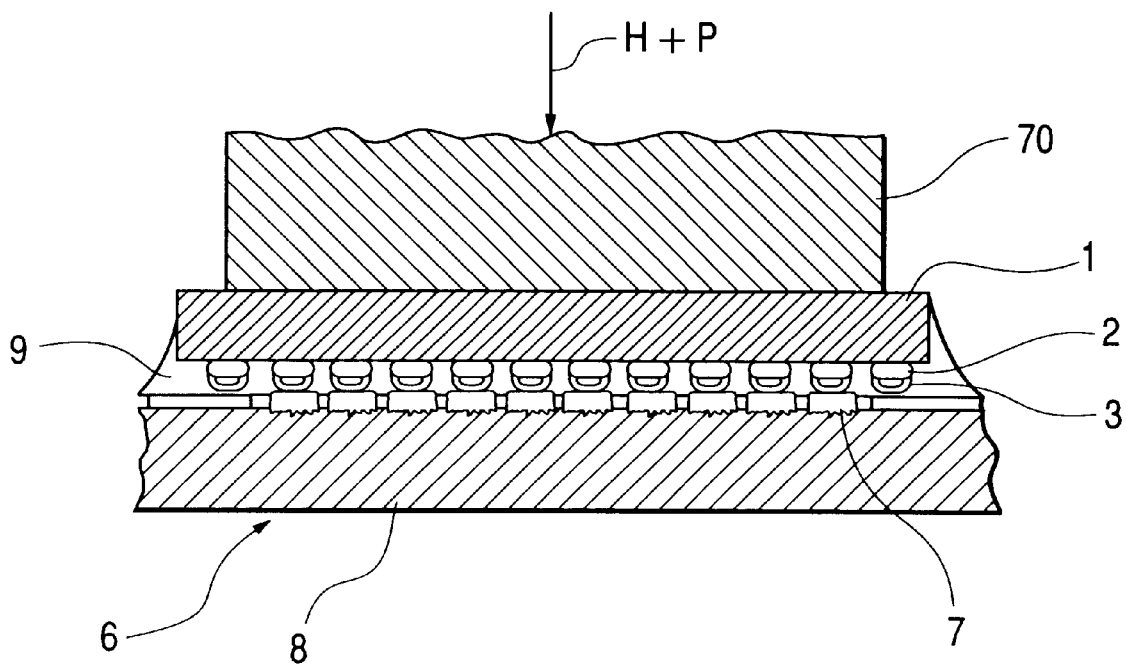
FIG. 7 is a sectional view showing a heating and pressurization stage in the arrangement/method of the present invention.
Figure 8:
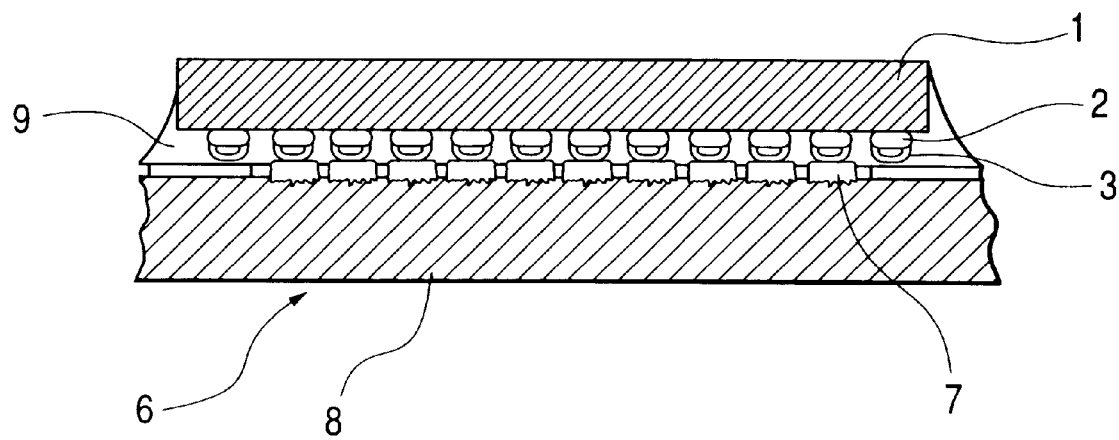
FIG. 8 is a sectional view of a final connecting structure after completion of the mounting method of FIG. 2.

FIG. 7 is a sectional view showing a heating and pressurization stage in the arrangement/method of the present invention. More particularly, with a pressure P (e.g., 30 g/bump×200 bumps=6 kg) being applied to bias the circuit substrate 6 toward the semiconductor IC device 1, at least one of the substrate 6 and/or semiconductor IC device 1 is heated at temperatures over a melting/softening temperature of the filling resin 9. Such pressurization/heating is held until a sufficient adhesive force is generated in the filling resin 9

Figure 9B:
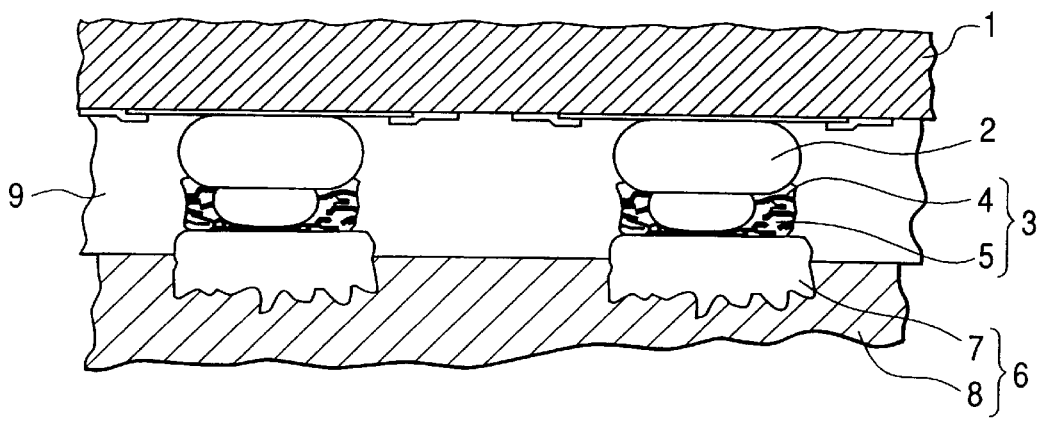
FIG. 9B is a magnified cross-sectional view of two bump/electrode areas near a beginning of the FIG. 7 heating and pressurization stage.

(FIG. 2's step 5; see FIG. 4). For example, a resin containing epoxy acrylate as its main skeleton will be sufficiently melted/softened if it is heated for 30 seconds at 180° C., so that no void is generated in the resin. FIG. 9B is a magnified cross-sectional view of two bump/electrode areas of the FIG. 7 stage, and is illustrative of the fact that filling resin 9 has been squeezed out between the bump/electrode pairs. Such is important because the electrically-insulating filling resin 9 thus will not impede an electrical conduction (i.e., will not represent a contaminant) between the bump/electrode pairs.

FIG. 9B is further illustrative of the fact that the conductive paste portions 3 begin to have substantially unequal distributions of conductive particles throughout the conductive paste portions. More particularly, as the minor portion of a conductive bump 2 nears an electrode 7, the larger conductive particles 4 within the filling resin are pinched between the bump/electrode pair and/or move slower than the smaller (i.e., more liquid melted/softened) thermoplastic resin particles. The smaller thermoplastic resin particles thus are squeezed and move to a periphery area surrounding the minor (i.e., nipple) portion of the bump, i.e., between the electrode 7 and the major portion of the bump 2. The result is a higher density (see FIG. 1C) of conductive particles in an area D directly (i.e., sandwiched or pinched) between the electrode 7 and the minor (i.e., nipple) portion of the bump 2, and a lower density of conductive particles in other (i.e., non-sandwiched or un-pinched) areas L due to dilution by the resin particles being squeezed thereto.

Such is very advantageous in that the highly concentrated conductive particle layer enhances an electrical conduction between the bump/electrode pair, while decreasing a contact resistance of such bump/electrode pair. In the present invention, the combination of the thermoplastic resin 5, conductive particles 4, heating, pressurization and time parameters should be selected to result in a contact resistance of less than 30 milli-ohms (mΩ), and more preferably, should be selected to result in a contact resistance of less than 10 mΩ. More particularly, as an example, if the conductive paste 3 is a thermoplastic resin having a silver-paradium alloy powder (having a preferred shape of flake, an average particle size of approximately 1 μm in thickness and 2–10 μm in diameter, and being provided within the resin at an original (i.e., before pressurization) concentration of 90 wt %), then heating at 150° C. and pressurizing at 20 g/bump for 10 seconds will result in a high density conductive particle concentration of more than 97 wt % in an area D directly (i.e., sandwiched or pinched) between the electrode 7 and the minor (i.e., nipple) portion of the bump 2, a lower density conductive particles concentration of 89–90 wt % in other (i.e., non-sandwiched or un-pinched) areas, and a contact resistance of approximately 40 mΩ.

The application of pressurization within the present invention is important in that such pressurization tends to improve (lower) contact resistance and (raise) a conductivity that would otherwise occur between a bump/electrode pair without application of pressurization. That is, if pressurization was not applied so at to squeeze out a substantial amount (if not substantially all) of the thermoplastic resin 5 from the area D directly (i.e., sandwiched or pinched) between the electrode 7 and the minor (i.e., nipple) portion of the bump 2, then such non-conducting thermoplastic resin would act as a contaminant lowering a conductivity and raising a resistance between the bump/electrode pair. As evidence of such contention, one combination of thermoplastic resin 5, conductive particles 4, heating and time parameters, not utilizing pressurization resulted in a contact resistance of approximately 40 milli-ohms (mΩ), whereas one combination utilizing pressurization resulted in a greatly improved contact resistance of approximately less than 10 mΩ.

As further important discussions, at early stages (see FIG. 9B) of the heating/pressurization, the electrode portion 7 and insulating layer 8 are not deformed. At later stages (see FIG. 9C) of the heating/pressurization, ones of the bumps 2, electrode portions 7 (e.g., 18 μm thickness) and/or insulating layer 8 may experience deformation as free space between some such components runs out to allow interference between such components while pressure is continued to be applied. More particularly, FIG. 9C's left bump/electrode pair is illustrated with the electrode 7D and insulating layer portion 8D having experienced deformation.

Figure 9C:
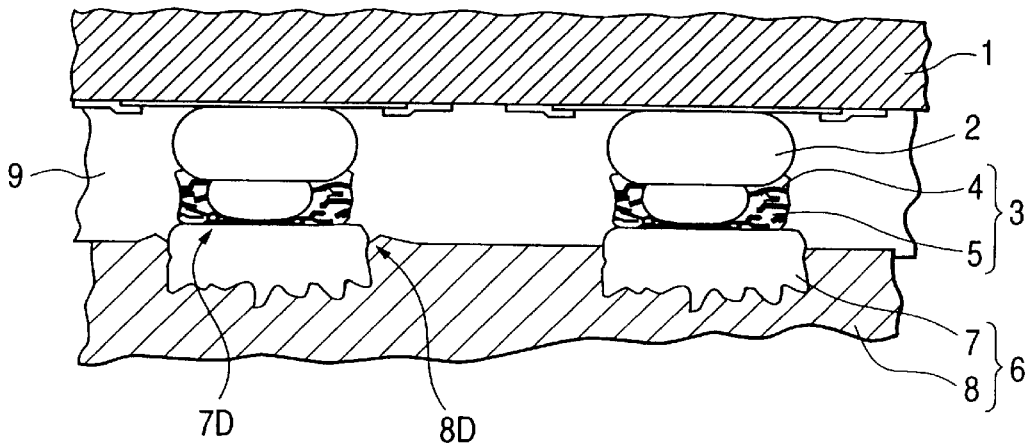
FIG. 9C is a magnified cross-sectional view of two bump/electrode areas near an end of the FIG. 7 heating and pressurization stage and/or the FIG. 8 final connected structure.

Additional discussion regarding deformation and advantages/importance of the dense conductive particle layer is appropriate. More particularly, when the bumps 2 are formed on the semiconductor IC 1, due to manufacturing limitations, such bumps do not extend a uniform distance (i.e., $H_B$ in FIG. 1) as measured from a surface of the semiconductor IC 1, i.e., some non-planarity deviation or variation occurs, for example, ±7 μm. Similarly, when the electrodes 7 are formed on the substrate 6, due to manufacturing limitations, such electrodes do not extend a uniform distance (i.e., $H_E$ in FIG. 1) as measured from a surface of the substrate 6, i.e., again, some non-planarity deviation or variation occurs, for example, ±7 μm. FIGS. 9A–C are illustrative of a situation where a left electrode 7 has a height which is higher than a right electrode. Accordingly, the left bump/electrode pair runs out of free space during the heating/pressurization stage, and experiences interference and collision/distortion. The right bump/electrode pair, on the other hand, has sufficient free space therebetween such that collision/distortion does not occur. One important function of the present invention's dense conductive particle layer, is that such layer adjustably fills in any such free space between each bump/electrode pair so as to improve (lower) contact resistance and (raise) a conductivity that would otherwise occur between such bump/electrode pair. A thickness (i.e., $H_S$ in FIG. 1) of the dense conductive particle layer is the same for both a distorted bump/electrode pair and a spaced bump/electrode pair, i.e., it is mechanical deformation of the bumps 2, electrode portions 7 (e.g., 18 μm thickness) and/or insulating layer 8 which mainly provides adjustment between interfering bump/electrode pairs.

Figure 10:
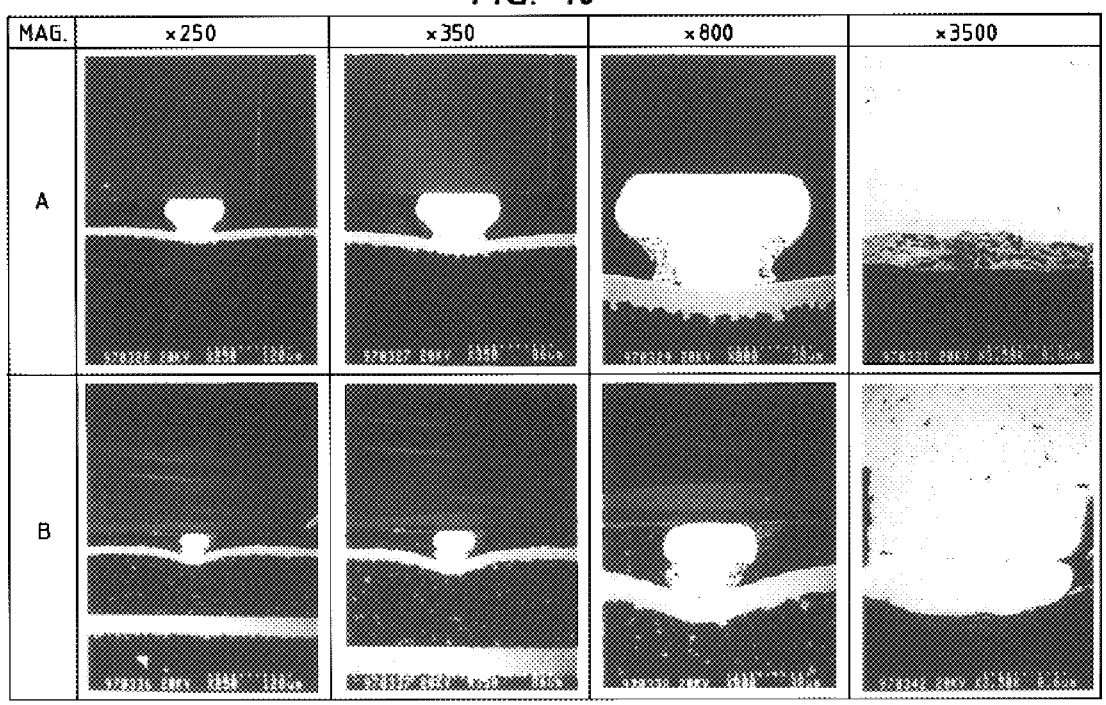
FIG. 10 are photographs showing a comparison between the present invention and a disadvantaged approach.

While the present invention does experience some deformation to ones of the bumps 2, electrode portions 7 and/or insulating layer 8 during pressurization, the experienced deformation is less than the deformation experienced by many other disadvantaged approaches. More particularly, FIG. 10 are photographs showing a comparison between the present invention and a disadvantaged approach. Turning to a discussion of the same, lower FIG. 10 photographs illustrate a disadvantaged approach "B". In such approach, a thermosetting (as opposed to thermoplastic) layer with conductive particles was coated onto the conductive bump, and was set to be hardened by a raised temperature.

Because a hardened (i.e., not flexible) thermoset layer is utilized, a high pressure (in comparison to the present invention) has to be applied during pressurization, causing several disadvantaged results. More particularly, the high pressurization causes ones of the hardened thermoset layers on the conductive bumps to fracture and move to an area around the conductive bump. Thus, such fractured thermoset layers do not improve (lower) contact resistance and (raise) a conductivity between such bump/electrode pair. In addition to damaging/fracturing of the thermoset layers, the high pressurization causes extreme distortion of ones of the bumps 2, electrode portions 7 and/or insulating layer 8. More particularly, The FIG. 10 lower photographs illustrate extreme distortion of both the substrate electrode and substrate. Such extreme distortion is disadvantageous in potentially causing many problems, e.g., peeling of the substrate electrode from the substrate, cracking or breaking of the substrate electrode, drastic changes in spacing and thus impedance between the substrate electrode and a substrate ground plane (straight lighter colored stripe in FIG. 10's lower photographs), and/or short circuits between the substrate electrode and substrate ground plane. In contrast, the arrangement of the present invention as illustrated in the upper photographs of FIG. 10 experiences much less drastic deformation, and therefore much less potential of peeling, cracking, breaking, impedance changes and/or short circuiting.

Moving discussion to yet a further advantage, the present invention also utilizes residual stresses in the underfill resin 9 and/or conductive paste 3 and/or the flexibility of the conductive paste in the areas L (FIG. 1C) to contradict or absorb linear expansion/contraction stresses in the connection arrangement, so as to result in an arrangement having a favorable number of expansion/contraction cycles (e.g., 1000). More particularly, contraction of the filling resin during cooling/setting (during manufacture) results in residual stresses within the connection arrangement. Further, continuation of pressurizing during cooling/setting can also add residual stresses. Such residual stresses and/or the flexibility of the conductive paste in the areas L (FIG. 1C) have been found to advantageously contradict or absorb linear expansion/contraction stresses during subsequent normal operation heating/cooling of the arrangement. Accordingly, an increased reliability can be secured.

To summarize the above discussions, the heating stage with the present invention has advantages. More particularly, the insulating resin 8 formed on the organic circuit substrate 6 is softened by heating so that the electrodes 7 and insulating resin 8 of the organic circuit substrate 6 can be deformed if necessary, under a relatively low pressure in comparison with a case where deformation is attempted without any heating. Further, the thermoplastic resin 5 in the conductive paste 3 interposed between the projecting bump 2 and the electrode portion 7 of the organic circuit substrate 6 is softened by heating, so that the softened thermoplastic resin is squeezed out around the projecting electrode 1 by pressure, thereby producing a region 10 in which the conductive particles 4 have a dense concentration.

In further summary, through the process described above, the mounting structure shown in FIG. 1 is obtained. In the flip-chip connecting structure shown in FIG. 1, any variation of heights of the projecting bumps 2 and the electrode portions 7 are compensated for by the dense conductive particle layer and/or by deformation of the electrode portion 7 or the resin 8 of the organic circuit substrate 6, thereby making it possible to improve a yield rate during production. Further, by forming a layer having a high density of the conductive particle 4 between each bump/electrode pair, a low-resistance/high-conductance connection can be realized. Further, by pressurizing and heating the filling resin 9 between the semiconductor IC device 1 and circuit substrate 7 when the filling resin 9 is loaded so as to harden the resin, the reliability can be secured.

Although according to the present embodiment, after the filling resin 9 is applied to the substrate, the semiconductor IC device 1 is mounted, it is permissible to mount the semiconductor IC 1 on the organic circuit substrate 6 and then fill a gap therebetween with the filling resin 9. As another variation, it is permissible to coat the electrodes 7 of the organic circuit substrate 6 with the conductive paste 3 instead of the bumps 2. Still further, the projecting bump 2 is not restricted to wire bump, but may be an ordinary extruded, punched bump or the like.

As described above, in formation of the flip-chip structure with the semiconductor IC device 1 and organic circuit substrate 6 of the present invention, a stable low-connecting resistance connection structure can be structured at a high yield rate without adding any special production process or any special material for the substrate. As a result, it is possible to realize a low cost flip-chip structure widely applicable to digital and analog IC chips alike. Thus, the present invention has high applicability to realize low cost and high function in any product field, e.g., from high-speed signal transmission systems to ordinary consumer electronic apparatus.

This concludes the description of the preferred embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art. For example, the conductive paste, heating and pressurization arrangement of the present invention to compensate for non-planarity of electrodes, may be applicable to larger environments besides semiconductor ICs, e.g., may be applicable to compensate for non-planar connections between laminated printed-circuit-board-to-printed-circuit-board connections.

What is claimed is:

1. A connected structure comprising: a first component having first electrodes; a second component having second electrodes corresponding to said first electrodes; and a thermoplastic conductive paste interposed between at least portions of both said first and said second electrodes and disposed adjacent to said first and said second electrodes, said conductive paste having conductive particles therein for enhancing electrical connection between said first electrodes and said second electrodes, and wherein a density of conductive particles within said conductive paste interposed in an area having a smallest separation distance between said first and second electrodes is greater than a density of conductive particles in other areas of said conductive paste disposed adjacent to said area.

2. A connected structure comprising: a first component having first electrodes; a second component having second electrodes corresponding to said first electrodes; and a thermoplastic conductive paste on at least portions of both said first electrodes and said second electrodes and having conductive particles therein for enhancing electrical connection between said first electrodes and said second electrodes, wherein said conductive paste has a higher density of conductive particles in an area having a smallest separation distance interposed directly between said first electrodes and said second electrodes, in comparison to a density of conductive particles of said conductive paste on other portions of said first electrodes and said second electrodes.

3. A flip-chip connected structure comprising: a semiconductor integrated circuit (IC) device having first electrodes; a circuit substrate having second electrodes corresponding to said first electrodes; and a thermoplastic conductive paste interposed between at least portions of both said first and said second electrodes and disposed adjacent to said first and said electrodes, said conductive paste having conductive particles therein for enhancing electrical connection between said first electrodes and said second electrodes, and wherein a density of conductive particles within said conductive paste interposed in an area having a smallest separation distance between said first and second electrodes is greater than a density of conductive particles within said conductive paste disposed adjacent to said first and second electrodes.

4. A flip-chip connected structure as claimed in claim 3, wherein said first electrodes are more specifically projecting electrodes in a form of at least one of a wire- bonded, extruded, plated, etched and die-punched bumps.

5. A flip-chip connected structure as claimed in claim 3, wherein said first electrodes are more specifically at least one of gold, silver and silver/tin alloy bumps.

6. A flip-chip connected structure as claimed in claim 3, wherein said second electrodes are more specifically at least one of printed circuit electrodes in a form of at least one of electrode pads and lines.

7. A flip-chip connected structure as claimed in claim 3, wherein said conductive paste more specifically comprises at least one of a thermoplastic resin and thermoplastic adhesive, and said conductive particles within said conductive paste are one of a gold powder, a silver powder and a silver palladium alloy powder.

8. A flip-chip connected structure as claimed in claim 3, wherein said density of conductive particles within said conductive paste interposed between said first and second electrodes is at a concentration of at least 97 wt %.

9. A flip-chip connected structure as claimed in claim 3, wherein contact resistance between electrically interconnected ones of said first and second electrodes is less than 50 milli-ohms.

10. A flip-chip connected structure as claimed in claim 3, wherein contact resistance between electrically interconnected ones of said first and second electrodes is less than 40 milli-ohms.

11. A flip-chip connected structure as claimed in claim 3, wherein contact resistance between electrically interconnected ones of said first and second electrodes is less than 30 milli-ohms.

12. A flip-chip connected structure as claimed in claim 3, wherein contact resistance between electrically interconnected ones of said first and second electrodes is less than 20 milli-ohms.

13. A flip-chip connected structure as claimed in claim 3, wherein contact resistance between electrically interconnected ones of said first and second electrodes is less than 10 milli-ohms.

14. An electronic device containing a flip-chip connected structure according to claim 3.

15. A flip-chip connected structure comprising: a semiconductor integrated circuit (IC) device having first electrodes; a circuit substrate having second electrodes corresponding to said first electrodes; and a thremoplastic conductive paste on at least portions of both said first electrodes and said second electrodes and having conductive particles therein for enhancing electrical connection between said first electrodes and said second electrodes, wherein said conductive paste has a higher density of conductive particles in an area having a smallest separation distance interposed directly between said first electrodes and said second electrodes, in comparison to a density of conductive particles of said conductive paste on other portions of said first electrodes and said second electrodes.

16. A flip-chip connected structure as claimed in claim 15, wherein said first electrodes are more specifically projecting electrodes in a form of at least one of a wire- bonded, extruded, plated, etched and die-punched bumps.

17. A flip-chip connected structure as claimed in claim 15, wherein said first electrodes are more specifically at least one of gold, silver and silver/tin alloy bumps.

18. A flip-chip connected structure as claimed in claim 15, wherein said second electrodes are more specifically at least one of printed circuit electrodes in a form of at least one of electrode pads and lines.

19. A flip-chip connected structure as claimed in claim 15, wherein said conductive paste more specifically comprises at least one of a thermoplastic resin and thermoplastic adhesive, and said conductive particles within said conductive paste are one of a gold powder, a silver powder and a silver palladium alloy powder.

20. A flip-chip connected structure as claimed in claim 15, wherein said density of conductive particles within said conductive paste interposed between said first and second electrodes is at a concentration of at least 97 wt %.

21. A flip-chip connected structure as claimed in claim 15, wherein contact resistance between electrically interconnected ones of said first and second electrodes is less than 50 milli-ohms.

22. A flip-chip connected structure as claimed in claim 15, wherein contact resistance between electrically interconnected ones of said first and second electrodes is less than 40 milli-ohms.

23. A flip-chip connected structure as claimed in claim 15, wherein contact resistance between electrically interconnected ones of said first and second electrodes is less than 30 milli-ohms.

24. A flip-chip connected structure as claimed in claim 15, wherein contact resistance between electrically interconnected ones of said first and second electrodes is less than 20 milli-ohms.

25. A flip-chip connected structure as claimed in claim 15, wherein contact resistance between electrically interconnected ones of said first and second electrodes is less than 10 milli-ohms.

26. An electronic device containing a flip-chip connected structure according to claim 15.

27. A connected structure comprising: a first component having first electrodes; a second component having second electrodes corresponding to said first electrodes; a thermoplastic conductive paste interposed between at least portions of both said first and said second electrodes and disposed adjacent to said first and said second electrodes, said conductive paste having conductive particles therein for enhancing electrical connection between said first electrodes and said second electrodes, and wherein a density of conductive particles within said conductive paste interposed in an area having a smallest separation distance between said first and second electrodes is greater than a density of conductive particles in other areas of said conductive paste disposed adjacent to said area; and, a sealing resin disposed between said first component and said second component, for at least sealing/confining said conductive paste to vicinities of said first and said second electrodes.

28. A connected structure comprising: a first component having first electrodes; a second component having second electrodes corresponding to said first electrodes; a thermoplastic conductive paste interposed between at least portions of both said first and said second electrodes and disposed adjacent to said first and said second electrodes, said thermoplastic conductive paste having conductive particles therein for enhancing electrical connection between said first electrodes and said second electrodes, and wherein a density of conductive particles within said thermoplastic conductive paste interposed in an area having a smallest separation distance between said first and second electrodes is greater than a density of conductive particles in other areas of said thermoplastic conductive paste disposed adjacent to said area; and, a thermo-setting sealing resin disposed between said first component and said second component, for at least sealing/confining said thermoplastic conductive paste to vicinities of said first and said second electrodes.

29. A connected structure comprising:

a first component having projecting first electrodes, a second component having second electrodes corresponding to said projecting first electrodes;

a thermoplastic conductive paste interposed between at least portions of both said projecting first and said second electrodes and disposed adjacent to said projecting first and said second electrodes, said thermoplastic conductive paste having conductive particles therein for enhancing electrical connection between said projecting first and said second electrodes, said thermoplastic conductive paste having a dense conductive particle portion in an area having a smallest separation distance interposed between said projecting first and said second electrodes, and wherein a density of conductive particles within said dense conductive particle portion is greater than a density of conductive particles in other areas of said thermoplastic conductive paste disposed adjacent to said projecting first and second electrodes; and a sealing resin disposed between the first component and the second component.

30. A connected structure comprising;

a IC chip having projecting first electrodes;

a Circuit substrate having second electrodes, a conductive paste interposed between at least said projecting first and said second electrodes, said conductive paste having a dense conductive particle portion pinched between each first-electrode/second-electrode pair, being substantially full of conductive particles for compensating for separation variation distances between first-electrode/second- electrode pairs; and a sealing resin disposed between the IC chip and the circuit substrate.

31. The connected structure according to clam 30, wherein said conductive paste is thermoplastic conductive paste.

32. The connected structure according to claim 31, wherein said dense conductive particles portion is formed by heating and pressuring so that resin is squeezed from a first portion of said thermoplastic conductive paste interposed directly between said projecting first and said second electrode to a second portion disposed adjacent to said projecting first and said second electrode.

33. A connected structure comprising:

a first component having projecting first electrodes;

a second component having second electrodes corresponding to said projecting first electrodes;

a thermoplastic conductive paste interpose between at least portions of both said projecting first and said second electrodes and disposed adjacent to said projecting first and said second electrodes, said thermoplastic conductive paste having conductive particles therein for enhancing electrical connection between said projecting first and said second electrodes, said thermoplastic conductive paste having a dense conductive particle portion interposed between projecting portion of said projecting first and said second electrodes, and wherein a density of conductive paticles within said dense conductive particle portion is greater than a density of conductive particles in other areas of said thermoplastic conductive paste disposed adjacent to said projecting first and second electrodes; and a sealing resin disposed between the first component and the second component.

34. A connected structure comprising: a first component having first electrodes; a second component having second electrodes corresponding to said first electrodes; and a conductive paste interposed between at least portions of both said first and said second electrodes and disposed adjacent to said first and said second electrodes, said conductive paste having conductive particles therein for enhancing electrical connection between said first electrodes and said second electrodes, and wherein a density of conductive particles within said conductive paste interposed in an area having a smallest separation distance between said first and second electrodes is greater than a density of conductive particles in other areas of said conductive paste disposed adjacent to said area.

35. A flip-chip connected structure comprising: a semiconductor integrated circuit (IC) device having first electrodes; a circuit substrate having second electrodes corresponding to said first electrodes; and a thermoplastic conductive paste interposed between at least portions of both said first and said second electrodes and disposed adjacent to said first and said electrodes, said conductive paste having conductive particles therein for enhancing electrical connection between said first electrodes and said second electrodes, and wherein a density of conductive particles within said conductive paste interposed in an area having a smallest separation distance between said first and second electrodes is greater than a density of conductive particles within said conductive paste disposed adjacent to said first and second electrodes.

* * * * *